(12) United States Patent
Asahi (10) Patent No.: US 11,990,662 B2
(45) Date of Patent: May 21, 2024

(54) HIGH-FREQUENCY TERMINATOR

(71) Applicants: KABUSHIKI KAISHA TOSHIBA, Tokyo (JP); TOSHIBA INFRASTRUCTURE SYSTEMS & SOLUTIONS CORPORATION, Kawasaki (JP)

(72) Inventor: Yasuaki Asahi, Kawasaki Kanagawa (JP)

(73) Assignees: Kabushiki Kaisha Toshiba, Tokyo (JP); Toshiba Infrastructure Systems & Solutions Corporation, Kawasaki (JP)

( * ) Notice: Subject to any disclaimer, the term of this patent is extended or adjusted under 35 U.S.C. 154(b) by 113 days.

(21) Appl. No.: 17/794,585

(22) PCT Filed: Jan. 19, 2021

(86) PCT No.: PCT/JP2021/001595
§ 371 (c)(1),
(2) Date: Jul. 21, 2022

(87) PCT Pub. No.: WO2021/149662
PCT Pub. Date: Jul. 29, 2021

(65) Prior Publication Data
US 2023/0069799 A1 Mar. 2, 2023

(30) Foreign Application Priority Data
Jan. 22, 2020 (JP) .................. 2020-008616

(51) Int. Cl.
*H01P 1/26* (2006.01)
(52) U.S. Cl.
CPC ............... *H01P 1/26* (2013.01); *H01P 1/268* (2013.01)

(58) Field of Classification Search
CPC .... H01P 1/268; H01P 1/26; H01P 1/24; H01P 1/22; H01P 1/227
(Continued)

(56) References Cited

U.S. PATENT DOCUMENTS 3,634,789 A 1/1972 Stuckert
4,267,531 A 5/1981 Spinner et al.
(Continued)

FOREIGN PATENT DOCUMENTS

JP S61-238102 A 10/1986
JP H4-276904 A 10/1992
(Continued)

OTHER PUBLICATIONS

The Int'l Bureau of WIPO, English translation of the International Preliminary Report on Patentability (IPER), 5 pages (dated Jul. 26, 2022).
(Continued)

*Primary Examiner* — Stephen E. Jones
(74) *Attorney, Agent, or Firm* — Finnegan, Henderson, Farabow, Garrett & Dunner, LLP (57) ABSTRACT

A high-frequency terminator includes a dielectric substrate, a metal layer provided on a back surface of the dielectric substrate, a transmission line provided on a front surface of the dielectric substrate, a resistor provided on the front surface of the dielectric substrate and connected to the transmission line, and a conductor electrically connecting the resistor and the metal layer. The dielectric substrate includes a first substrate part having a first thickness in a direction from the back surface toward the front surface, and a second substrate part having a second thickness in the direction that is less than the first thickness. The transmission line extends from the first substrate part to the second substrate part and is connected to the resistor on the second
(Continued)

substrate part. The conductor electrically connects the metal layer and the resistor at the second substrate part.

7 Claims, 11 Drawing Sheets

(58) Field of Classification Search
USPC .............................................. 333/22 R, 81 A
See application file for complete search history.

(56) References Cited

U.S. PATENT DOCUMENTS

| | | | |
|---|---|---|---|
| 6,525,631 B1 * | 2/2003 | Oldfield | .................. H01P 1/268 |
| | | | 333/206 |
| 2001/0048592 A1 | 12/2001 | Ninomiya | |
| 2003/0057181 A1 | 3/2003 | Oldfield | |

FOREIGN PATENT DOCUMENTS

| | | |
|---|---|---|
| JP | H5-129805 A | 5/1993 |
| JP | H6-318804 A | 11/1994 |

OTHER PUBLICATIONS

European Patent Office, Extended European Search Report, 9 pages (Jan. 18, 2024).

* cited by examiner

HIGH-FREQUENCY TERMINATOR

TECHNICAL FIELD

Embodiments relate to a high-frequency terminator.

BACKGROUND ART

It is desirable in a high-frequency circuit to widen the bandwidth of a termination part. There is a grounding structure, for example, in which a thin film resistance is provided on a dielectric substrate such that one side of the thin film resistance is connected to a microstrip line and the other side thereof is connected to the back surface side of the substrate via a connection conductor or a through-hole. In such a termination, the inductance of the connection conductor or the through-hole cannot be ignored, and makes the impedance increase in the high-frequency band. It is therefore difficult to suppress reflections of the high-frequency signal, which hinders wider bandwidths.

PRIOR ART DOCUMENTS

Patent Literature

[Patent Document 1]
JP H6-318804 A (Kokai)

SUMMARY OF INVENTION

Technical Problem

Embodiments provide a high-frequency terminator which can reduce the reflections of a high-frequency signal.

Solution to Problem

According to an embodiment, a high-frequency terminator includes a dielectric substrate, a metal layer provided at a back surface side of the dielectric substrate, a transmission line provided at a front surface side of the dielectric substrate, a resistor provided at the front surface side of the dielectric substrate and connected to the transmission line, and a conductor electrically connecting the resistor and the metal layer. The dielectric substrate includes a first substrate part having a first thickness in a first direction from the back surface toward the front surface, and a second substrate part having a second thickness in the first direction that is less than the first thickness. The front surface of the dielectric substrate is flat; and a step between the first substrate part and the second substrate part is provided in the back surface side. The transmission line extends from the first substrate part to the second substrate part and is connected to the resistor on the second substrate part. The conductor electrically connects the metal layer and the resistor at the second substrate part.

DESCRIPTION OF EMBODIMENTS

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
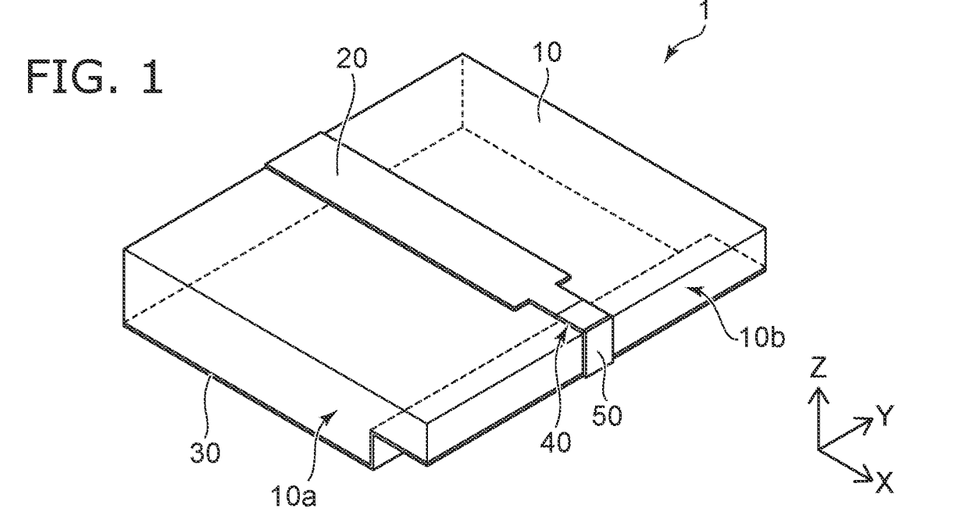
FIG. 1 is a perspective view schematically showing a high-frequency terminator according to a first embodiment.

FIG. 1 is a perspective view schematically showing a high-frequency terminator 1 according to a first embodiment. The high-frequency terminator 1 includes, for example, a dielectric substrate 10, a transmission line 20, a metal layer 30, a resistor 40, and a connection conductor 50.

The dielectric substrate 10 is, for example, a ceramic material of aluminum oxide, etc. The relative dielectric constant of the dielectric substrate 10 is, for example, 9.8, and tan δ is, for example, 0.0001. The transmission line 20 and the connection conductor 50 are, for example, metal materials that include gold (Au). The metal layer 30 includes, for example, Au. The resistor 40 is, for example, a thin film resistance of tantalum nitride, etc.

As shown in FIG. 1, the dielectric substrate 10 includes a first substrate part 10a and a second substrate part 10b. The first substrate part 10a is thicker than the second substrate part 10b in the direction (e.g., a Z-direction) from the back surface toward the front surface of the dielectric substrate 10. The second substrate part 10b is provided at, for example, the outer edge of the dielectric substrate 10.

The transmission line 20 is provided at the front surface side of the dielectric substrate 10 and extends from the first substrate part 10a to the second substrate part 10b. The transmission line 20 is, for example, a microstrip line having a characteristic impedance of 50Ω.

The metal layer 30 is provided at the back surface side of the dielectric substrate 10. The metal layer 30 covers, for example, the entire back surface of the dielectric substrate 10.

The resistor 40 is provided at the front surface side of the second substrate part 10b. The transmission line 20 is electrically connected to the resistor 40 at the front surface side of the second substrate part 10b. The resistor 40 has a resistance value of, for example, 50Ω.

The connection conductor 50 is selectively provided on, for example, a side surface linking the front and back surfaces of the second substrate part 10b. The connection conductor 50 extends in the Z-direction. The connection conductor 50 is electrically connected to the metal layer 30 at the back surface side of the second substrate part 10b, and is electrically connected to the resistor 40 at the front surface side thereof.

Figure 2A:
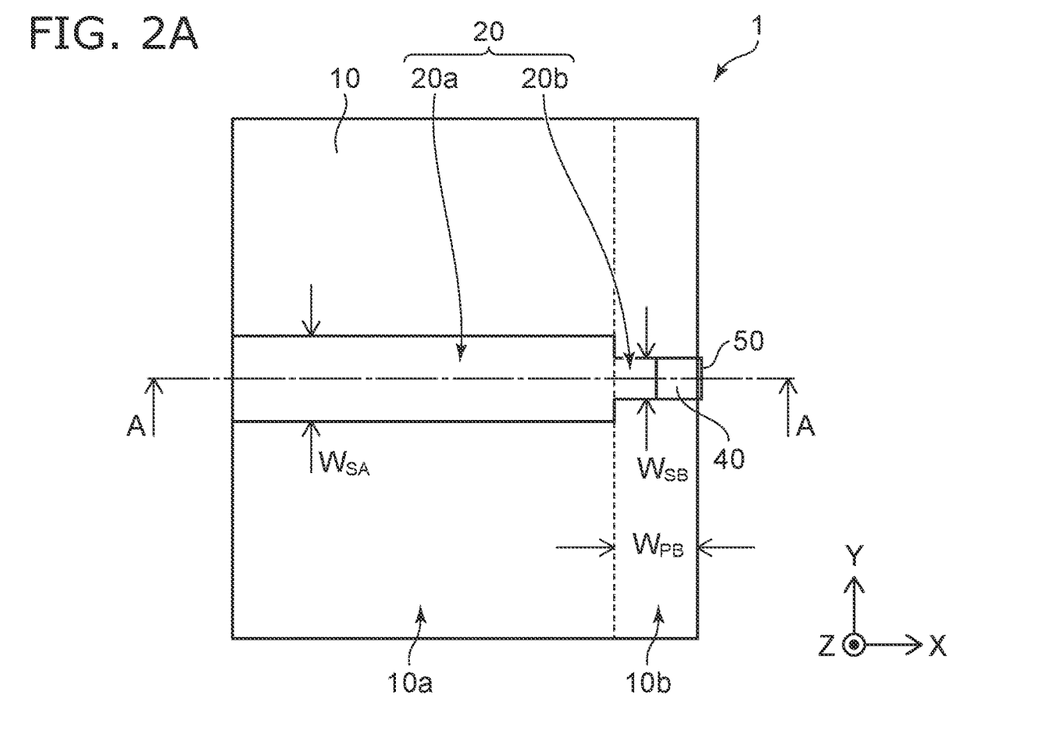
FIG. 2 is a three-view projection schematically showing the high-frequency terminator according to the first embodiment.
Figure 2B:
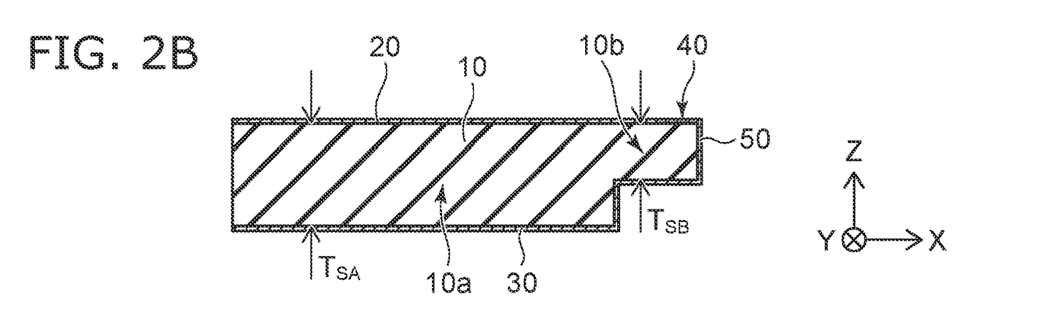
Figure 2C:
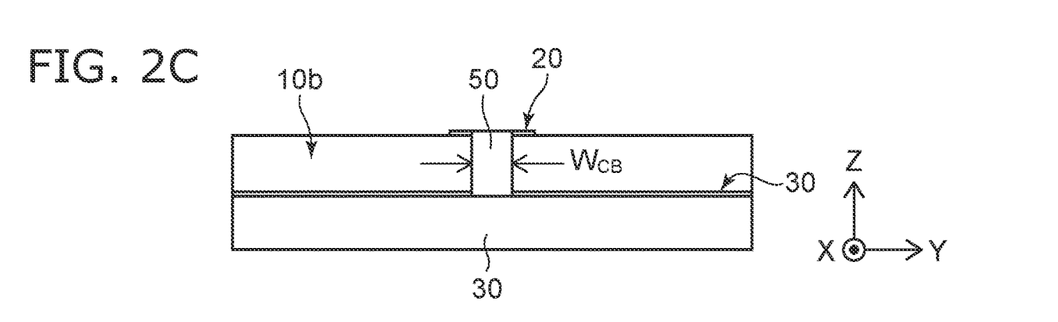

FIGS. 2A to 2C are a three-view projection schematically showing the high-frequency terminator 1 according to the first embodiment. FIG. 2A is a plan view showing the upper surface of the high-frequency terminator 1. FIG. 2B is a cross-sectional view along line A-A shown in FIG. 2A. FIG. 2C is a schematic view showing a side surface at the right side of the high-frequency terminator 1.

As shown in FIG. 2A, the transmission line 20 extends in an X-direction and includes a first line part 20a and a second line part 20b. The first line part 20a and the second line part 20b are arranged in the X-direction. The first line part 20a is positioned on the first substrate part 10a. The second line part 20b is positioned on the second substrate part 10b.

The first line part 20a has a first width $W_{SA}$ in a Y-direction; and the second line part 20b has a second width $W_{SB}$ in the Y-direction. The first width $W_{SA}$ is greater than the second width $W_{SB}$. The first width $W_{SA}$ is, for example, 0.16 mm, and the second width $W_{SB}$ is, for example, 0.08 mm.

The Y-direction width of the resistor 40 is substantially equal to the second width $W_{SB}$. Also, the X-direction width of the resistor 40 is substantially equal to the second width $W_{SB}$.

As shown in FIG. 2B, for example, the second substrate part 10b is provided to jut in the X-direction from the upper portion of the first substrate part 10a. In other words, the front surface of the dielectric substrate 10 is flat. Also, the dielectric substrate 10 includes a step positioned at the boundary between the first substrate part 10a and the second substrate part 10b in the back surface side.

The second substrate part 10b is formed by, for example, cutting the back surface side of the dielectric substrate 10. A width $W_{PB}$ in the X-direction of the second substrate part 10b (see FIG. 2A) is, for example, 0.16 mm.

The first substrate part 10a has a first thickness $T_{SA}$ in the Z-direction; and the second substrate part 10b has a second thickness $T_{SB}$ in the Z-direction. The first thickness $T_{SA}$ is greater than the second thickness $T_{SB}$. The first thickness $T_{SA}$ is, for example, 0.2 mm, and the second thickness $T_{SB}$ is, for example, 0.1 mm.

The metal layer 30 covers the back surface of the dielectric substrate 10 and covers the step between the first substrate part 10a and the second substrate part 10b.

As shown in FIG. 2C, the connection conductor 50 is provided on the side surface of the second substrate part 10b. A width $W_{CB}$ in the Y-direction of the connection conductor 50 is, for example, substantially equal to the Y-direction width of the resistor 40. In other words, the width $W_{CB}$ of the connection conductor 50 is substantially equal to the second width $W_{CB}$ in the Y-direction of the second line part 20b. Also, the Z-direction length of the connection conductor 50 is, for example, substantially equal to the second thickness $T_{SB}$ of the second substrate part 10b.

Figure 3:
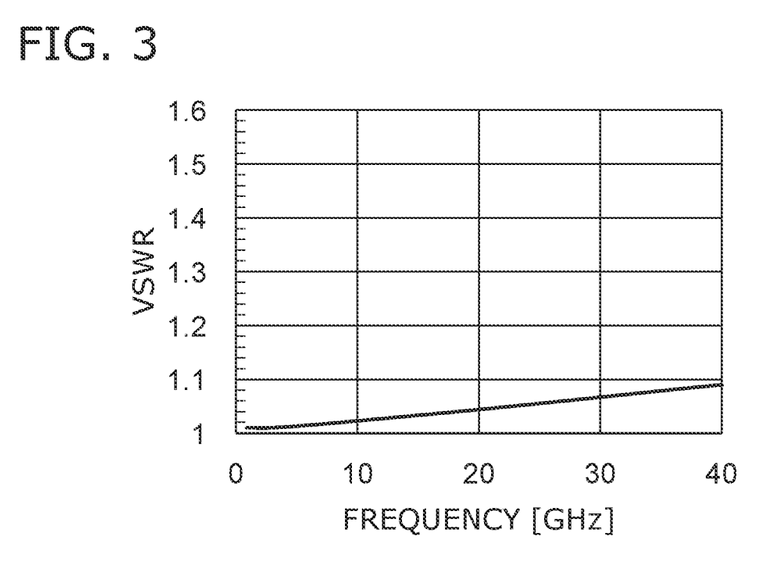
FIG. 3 is a graph showing a characteristic of the high-frequency terminator according to the first embodiment.

FIG. 3 is a graph showing a characteristic of the high-frequency terminator 1 according to the first embodiment. The horizontal axis is the frequency (GHz) of a high-frequency signal; and the vertical axis is the voltage standing wave ratio VSWR (Voltage Standing Wave Ratio) of the transmission line 20.

As shown in FIG. 3, the VSWR of the high-frequency terminator 1 is not more than 1.1 up to 40 GHz. The reflections of the high-frequency signal are suppressed more at the terminal of the transmission line, for example, as the VSWR approaches 1 in the transmission line 20.

Figure 4A:
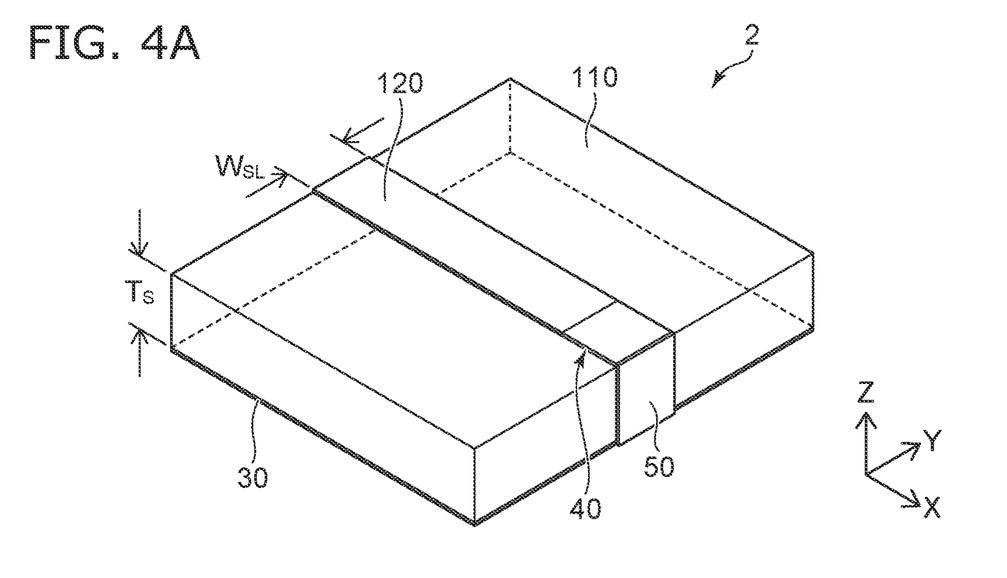
FIG. 4 is a schematic view showing a high-frequency terminator according to a comparative example of the first embodiment.
Figure 4B:
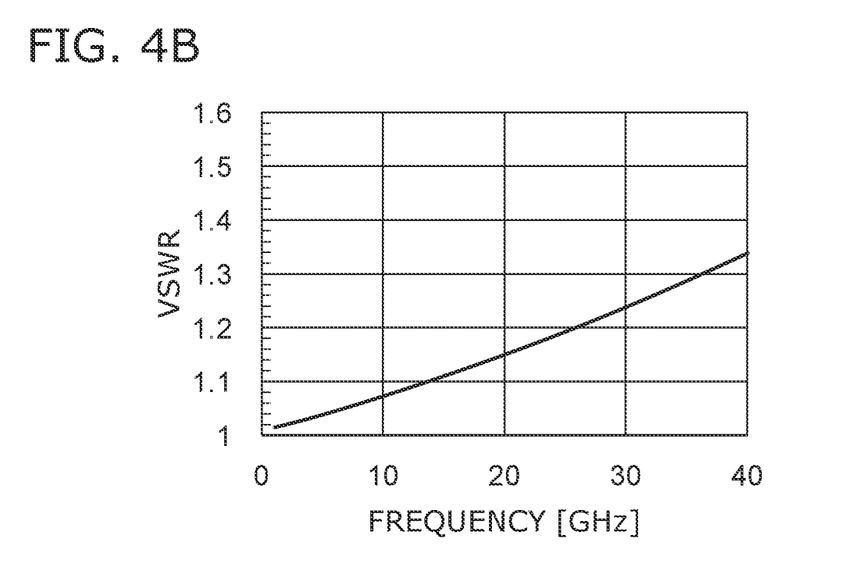

FIGS. 4A and 4B are schematic views showing a high-frequency terminator 2 according to a comparative example of the first embodiment. FIG. 4A is a perspective view showing the high-frequency terminator 2. FIG. 4B is a graph showing a characteristic of the high-frequency terminator 2. The horizontal axis of FIG. 4B is the frequency, and the vertical axis is the VSWR.

As shown in FIG. 4A, the high-frequency terminator 2 includes a dielectric substrate 110, a transmission line 120, the metal layer 30, the resistor 40, and the connection conductor 50.

The dielectric substrate 110 includes the same material as the dielectric substrate 10. The dielectric substrate 110 has a uniform thickness $T_S$ in the Z-direction over the entirety. The thickness $T_S$ of the dielectric substrate 110 is equal to the first thickness $T_{SA}$ of the first substrate part 10a of the dielectric substrate 10. The relative dielectric constant of the dielectric substrate 110 is, for example, 9.8, and tan δ is, for example, 0.0001.

The transmission line 120 is provided on the front surface of the dielectric substrate 110. The transmission line 120 has a width $W_{SL}$ in the Y-direction. The width $W_{SL}$ of the transmission line 120 is uniform over the entirety and is equal to the first width $W_{SA}$ of the first line part 20a of the transmission line 20.

The resistor 40 is electrically connected to the transmission line 120 at the front surface side of the dielectric substrate 110. The resistor 40 has the same Y-direction width as the width $W_{SL}$ of the transmission line 120. Also, the X-direction width of the resistor 40 is equal to the width $W_{SL}$ of the transmission line 120. The resistance value of the resistor 40 is 50Ω.

The connection conductor 50 electrically connects the resistor 40 and the metal layer 30 provided on the back surface of the dielectric substrate 110.

As shown in FIG. 4B, the VSWR of the high-frequency terminator 2 is greater than 1.1 at frequencies greater than 10.3 GHz and increases as the frequency increases. In the high-frequency terminator 2, the reflections in the high-frequency region are large compared to the characteristic of the high-frequency terminator 1 shown in FIG. 3.

The high-frequency terminator 2 may obtain the same VSWR as the high-frequency terminator 1 when the thickness $T_S$ of the dielectric substrate 110 is equal to the second thickness $T_{SB}$ of the second substrate part 10b of the dielectric substrate 10 and the width $W_{SL}$ of the transmission line 120 is equal to the second width $W_{SB}$ of the second line part 20b of the transmission line 20. When the thickness of the dielectric substrate 110 is set to the second thickness $T_{SB}$, however, the mechanical strength thereof is greatly reduced.

In the high-frequency terminator 1 according to the embodiment, by using the dielectric substrate 10 that includes the first and second substrate parts 10a and 10b, the VSWR can be improved in the high-frequency band while maintaining the strength of the dielectric substrate.

Figure 5A:
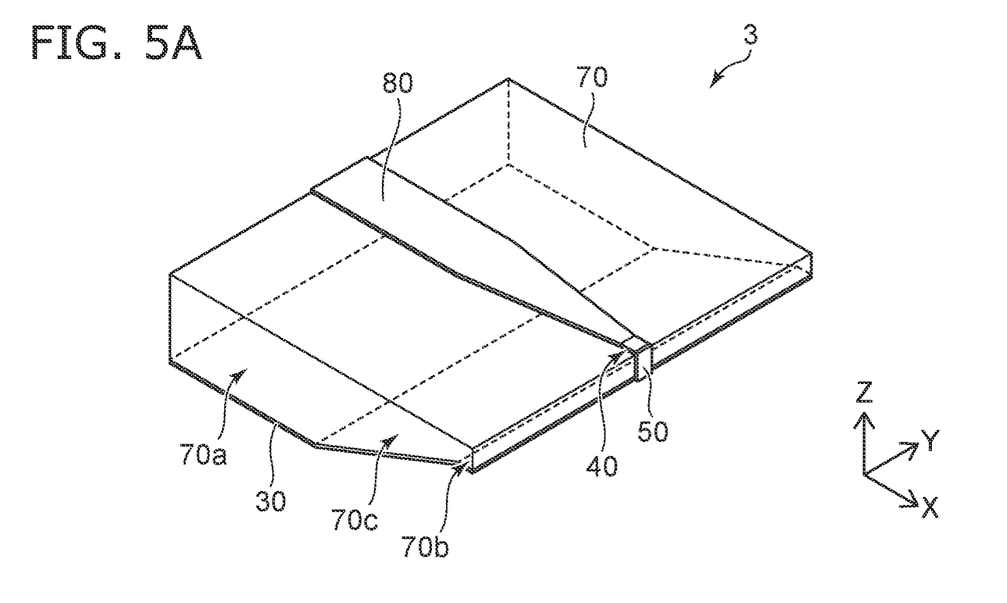
FIG. 5 is a schematic view showing a high-frequency terminator according to a modification of the first embodiment.
Figure 5B:
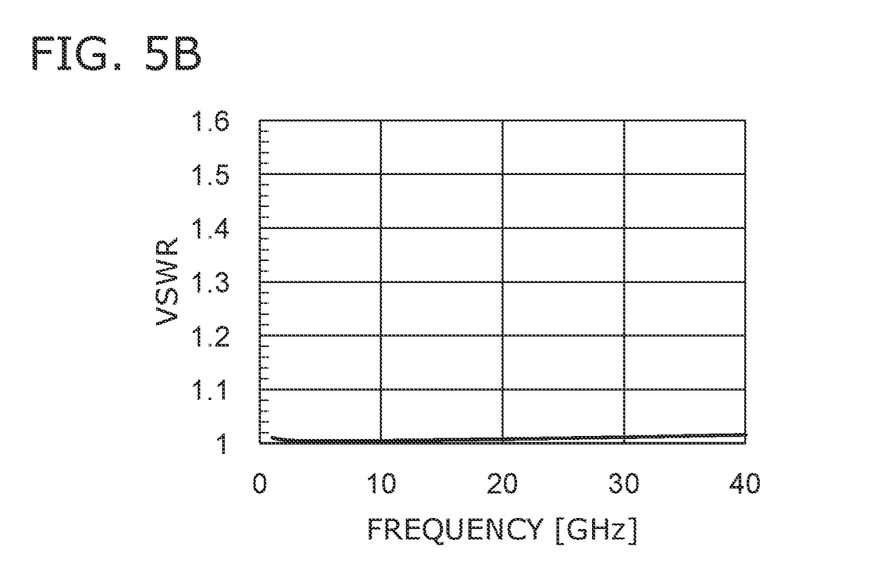

FIGS. 5A and 5B are schematic views showing a high-frequency terminator 3 according to a modification of the first embodiment. FIG. 5A is a perspective view showing the high-frequency terminator 3. FIG. 5B is a graph showing a characteristic of the high-frequency terminator 3. The horizontal axis of FIG. 5B is the frequency, and the vertical axis is the VSWR.

As shown in FIG. 5A, the high-frequency terminator 3 includes a dielectric substrate 70, a transmission line 80, the metal layer 30, the resistor 40, and the connection conductor 50. The dielectric substrate 70 is, for example, a ceramic substrate including aluminum oxide. The relative dielectric constant of the dielectric substrate 70 is, for example, 9.8, and tan δ is, for example, 0.0001.

The dielectric substrate 70 includes a first substrate part 70a, a second substrate part 70b, and a third substrate part 70c. The first substrate part 70a, the second substrate part 70b, and the third substrate part 70c are arranged in the extension direction (the X-direction) of the transmission line 80; and the third substrate part 70c is positioned between the first substrate part 70a and the second substrate part 70b. The relative dielectric constant of the dielectric substrate 70 is, for example, 9.8, and tang is, for example, 0.0001.

The Z-direction thickness of the first substrate part 70a is greater than the Z-direction thickness of the second substrate part 70b; and the Z-direction thickness of the third substrate part 70c gradually decreases in the direction (the X-direction) from the first substrate part 70a toward the second substrate part 70b.

The transmission line 80 is provided at the front surface side of the dielectric substrate 70. The front surface of the dielectric substrate 70 is flat; and the transmission line 80 extends from the first substrate part 70a toward the third substrate part 70c.

The resistor 40 is provided at the front surface side of the second substrate part 70b; and the transmission line 80 is electrically connected to the resistor 40. The portion of the transmission line 80 positioned at the front surface side of the third substrate part 70c is provided so that the Y-direction width becomes narrow toward the resistor 40.

The connection conductor 50 is provided on the side surface of the second substrate part 70b and electrically connects the resistor 40 and the metal layer 30 covering the back surface of the dielectric substrate 70.

As shown in FIG. 5B, the VSWR of the high-frequency terminator 3 is, for example, not more than 1.02 up to a frequency of 40 GHz. In other words, the VSWR is improved more than the VSWR of the high-frequency terminator 1 shown in FIG. 3.

Figure 6A:
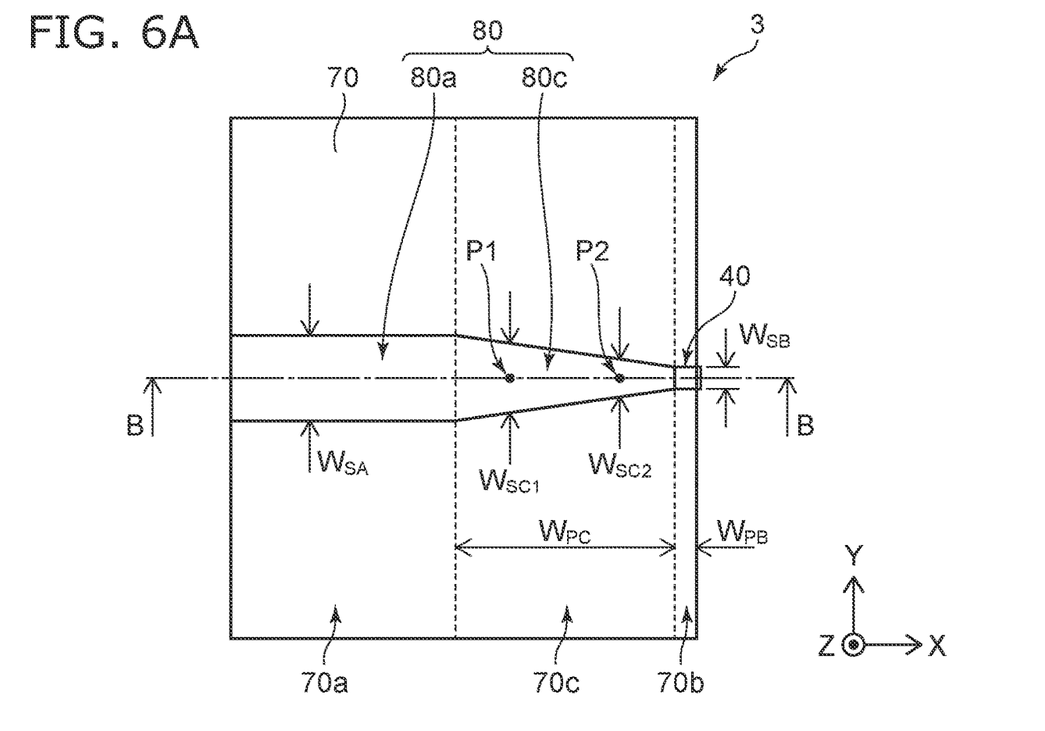
FIG. 6 is a three-view projection schematically showing the high-frequency terminator according to the modification of the first embodiment.
Figure 6B:
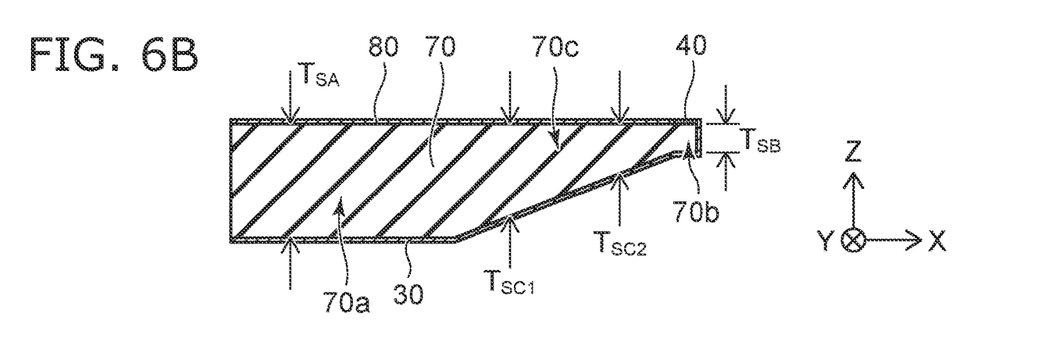
Figure 6C:
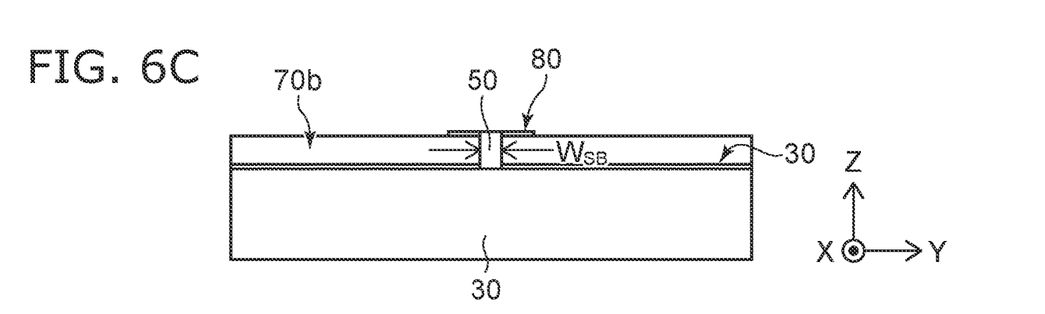

FIGS. 6A to 6C are a three-view projection schematically showing the high-frequency terminator 3. FIG. 6A is a plan view showing the upper surface of the high-frequency terminator 3. FIG. 6B is a cross-sectional view along line B-B shown in FIG. 6A. FIG. 6C is a schematic view showing a side surface at the right side of the high-frequency terminator 3.

As shown in FIG. 6A, the transmission line 80 includes a first line part 80a and a second line part 80c. The first line part 80a is provided on the front surface of the first substrate part 70a. The second line part 80c is provided on the front surface of the third substrate part 70c.

The first line part 80a has the first width $W_{SA}$ in the Y-direction. The second line part 80c has a Y-direction width that gradually narrows in the direction toward the resistor 40. The second line part 80c has, for example, a first width $W_{SC1}$ in the Y-direction and a second width $W_{SC2}$ in the Y-direction respectively at a first position P1 and a second position P2 along the X-direction. The second position P2 is more proximate to the resistor 40 than the first position P1; and the second width $W_{SC2}$ is less than the first width $W_{SC1}$.

The Y-direction width of the second line part 80c at the boundary between the first line part 80a and the second line part 80c is equal to the first width $W_{SA}$. Also, the Y-direction width of the second line part 80c at the end at which the second line part 80c is connected to the resistor 40 is substantially equal to the second width $W_{SB}$ in the Y-direction of the resistor 40.

As shown in FIG. 6B, the first substrate part 70a has the first thickness $T_{SA}$ in the Z-direction. The second substrate part 70b has the second thickness $T_{SB}$ in the Z-direction. The third substrate part 70c, for example, has a first thickness $T_{SC1}$ in the Z-direction at the first position P1, and has a second thickness $T_{SC2}$ in the Z-direction at the second position P2. The second thickness $T_{SC2}$ is less than the first thickness $T_{SC1}$.

The Z-direction thickness of the third substrate part 70c at the boundary between the first substrate part 70a and the third substrate part 70c is substantially equal to the first thickness $T_{SA}$. Also, the Z-direction thickness of the third substrate part 70c at the boundary between the second substrate part 70b and the third substrate part 70c is substantially equal to the second thickness $T_{SB}$.

The Z-direction thickness of the dielectric substrate 70 and the Y-direction width of the transmission line 80 are set so that the characteristic impedance of the transmission line 80 is, for example, 50Ω. Also, the resistance value of the resistor 40 is, for example, 50Ω. The X-direction width of the resistor 40 is, for example, substantially equal to the second width $W_{SB}$ in the Y-direction.

In the example, the first thickness $T_{SA}$ of the dielectric substrate 70 is, for example, 0.2 mm, and the second thickness $T_{SB}$ is, for example, 0.05 mm. The first width $W_{SA}$ of the transmission line 80 is, for example, 0.16 mm, and the second width $W_{SB}$ is, for example, 0.04 mm. The upper surface of the resistor 40 is, for example, a 0.04 mm×0.04 mm square.

The width $W_{PB}$ in the X-direction of the second substrate part 70b is, for example, 0.04 mm which is equal to the X-direction width of the resistor 40 (see FIG. 6A). Also, a width $W_{PC}$ in the X-direction of the third substrate part 70c is, for example, 0.4 mm (see FIG. 6A).

As shown in FIG. 6C, the connection conductor 50 is provided on the side surface at the right side of the second substrate part 70b. The connection conductor 50 has a Z-direction length substantially same as the second thickness $T_{SB}$ in the Z-direction of the second substrate part 70b (see FIG. 6B). Also, the Y-direction width of the connection conductor 50 is, for example, substantially equal to the second width $W_{SB}$ in the Y-direction of the resistor 40.

In the high-frequency terminator 3, the first line part 80a and the second line part 80c are provided so that the first line part 80a and the second line part 80c have the same Y-direction width (the first width $W_{SA}$) at the boundary between the first line part 80a and the second line part 80c.

Therefore, the reflections of the high-frequency signal can be suppressed at the boundary between the first line part 80a and the second line part 80c.

In the high-frequency terminator 1 shown in FIG. 1, for example, the Y-direction width of the first line part 20a and the Y-direction width of the second line part 20b are different at the boundary between the first line part 20a and the second line part 20b. Therefore, in the high-frequency terminator 1, compared to the high-frequency terminator 3, the reflections of the high-frequency signal are large at the boundary between the first line part 20a and the second line part 20b.

Thus, in the high-frequency terminator 3, the VSWR can be improved by setting the Y-direction width of the first line part 20a and the Y-direction width of the second line part 20b to be the same at the boundary between the first line part 80a and the second line part 80c.

Second Embodiment

Figure 7A:
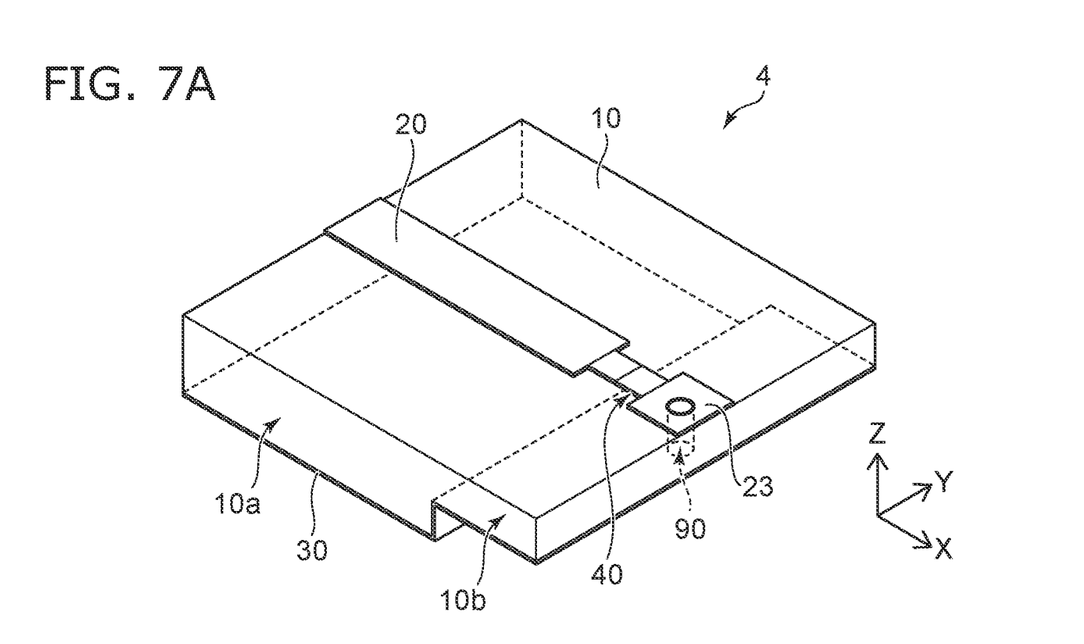
FIG. 7 is a schematic view showing a high-frequency terminator according to a second embodiment.
Figure 7B:
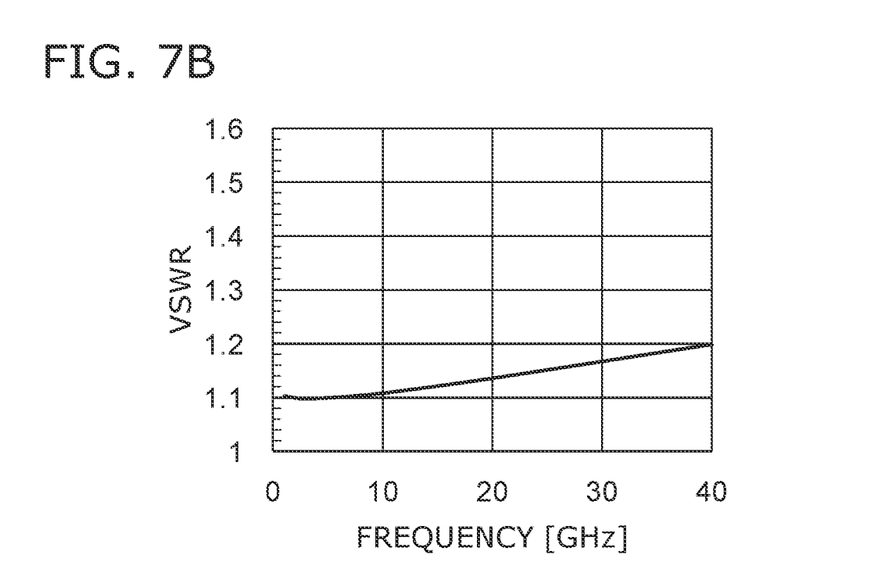

FIGS. 7A and 7B are schematic views showing a high-frequency terminator 4 according to a second embodiment. FIG. 7A is a perspective view showing the high-frequency terminator 4. FIG. 7B is a graph showing a characteristic of the high-frequency terminator 4. In FIG. 7B, the horizontal axis is the frequency, and the vertical axis is the VSWR.

As shown in FIG. 7A, the high-frequency terminator 4 includes the dielectric substrate 10, the transmission line 20, a transmission line 23, the metal layer 30, the resistor 40, and a through-hole 90. The dielectric substrate 10 is, for example, a ceramic substrate that includes aluminum oxide. The relative dielectric constant of the dielectric substrate 10 is, for example, 9.8, and tan δ is, for example, 0.0001.

The dielectric substrate 10 includes the first substrate part 10a and the second substrate part 10b. The first substrate part 10a and the second substrate part 10b are arranged in the extension direction (the X-direction) of the transmission line 20. The Z-direction thickness of the first substrate part 10a is greater than the Z-direction thickness of the second substrate part 10b. The dielectric substrate 10 includes a flat front surface, and includes a step positioned at the boundary between the first substrate part 10a and the second substrate part 10b in the back surface side.

The transmission line 20 is provided on the front surface of the dielectric substrate 10. The transmission line 20 extends from the first substrate part 10a toward the second substrate part 10b. The Y-direction width of the transmission line 20 at the portion positioned on the front surface of the second substrate part 10b is less than the Y-direction width of the transmission line 20 at the portion positioned at the front surface side of the first substrate part 10a. The transmission line 23 is provided at the front surface side of the second substrate part 10b.

The metal layer 30 is provided at the back surface side of the dielectric substrate 10. The metal layer 30, for example, is provided to cover the entire back surface of the dielectric substrate 10. Also, the metal layer 30 covers the step positioned at the boundary between the first substrate part 10a and the second substrate part 10b.

The resistor 40 is provided at the front surface side of the second substrate part 10b. The resistor 40 is positioned between the transmission line 20 and the transmission line 23; and the transmission lines 20 and 23 are electrically connected to the resistor 40.

The through-hole 90 is provided to extend through the second substrate part 10b in the Z-direction. The through-hole 90 electrically connects the transmission line 23 and the metal layer 30. In other words, the transmission line 20 is electrically connected to the metal layer 30 via the resistor 40, the transmission line 23, and the through-hole 90.

As shown in FIG. 7B, the VSWR of the high-frequency terminator 4 is, for example, not more than 1.2 up to a frequency of 40 GHz.

Figure 8A:
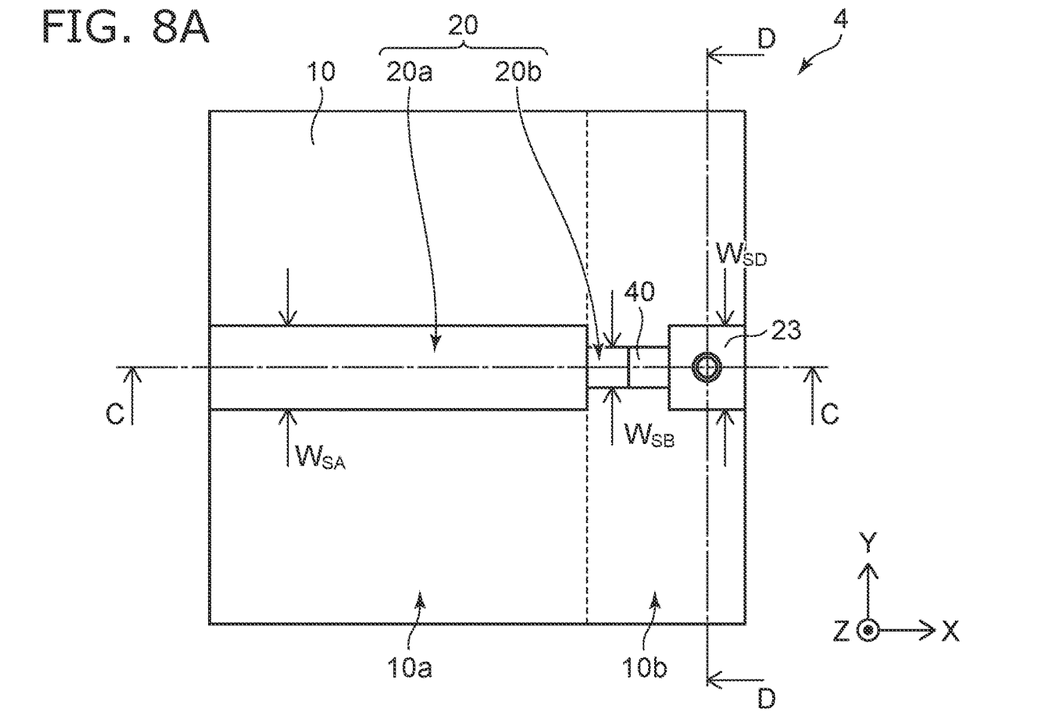
FIG. 8 is a three-view projection schematically showing the high-frequency terminator according to the second embodiment.
Figure 8B:
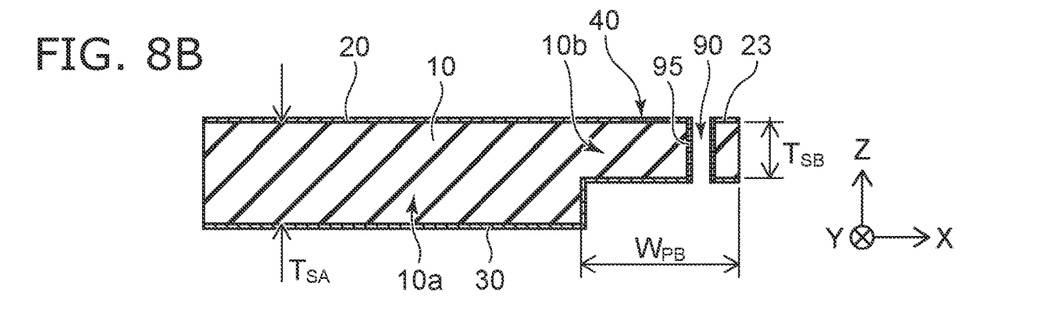
Figure 8C:
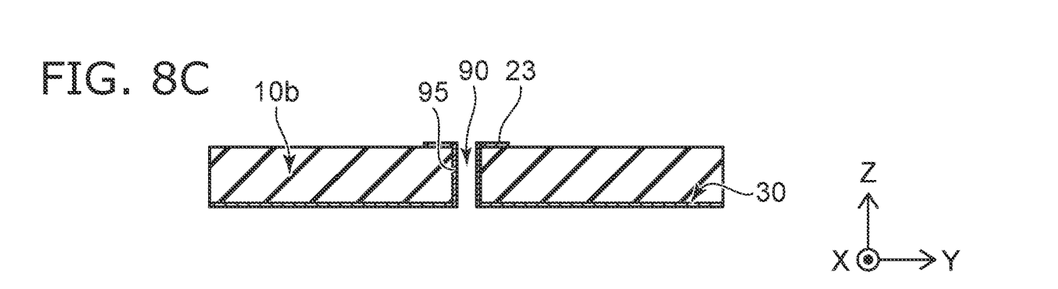

FIGS. 8A to 8C are a three-view projection schematically showing the high-frequency terminator 4 according to the second embodiment. FIG. 8A is a plan view showing the upper surface of the high-frequency terminator 4. FIG. 8B is a cross-sectional view along line C-C shown in FIG. 8A. FIG. 8C is a cross-sectional view along line D-D shown in FIG. 8A.

As shown in FIG. 8A, the transmission line 20 extends in the X-direction and includes the first line part 20a and the second line part 20b. The first line part 20a and the second line part 20b are arranged in the X-direction. The first line part 20a is positioned on the first substrate part 10a. The second line part 20b is positioned on the second substrate part 10b.

The first line part 20a has the first width $W_{SA}$ in the Y-direction; and the second line part 20b has the second width $W_{SB}$ in the Y-direction. The first width $W_{SA}$ is greater than the second width $W_{SB}$. The first width $W_{SA}$ is, for example, 0.16 mm, and the second width $W_{SB}$ is, for example, 0.08 mm.

The transmission line 23 has, for example, a third width $W_{SD}$ in the Y-direction. The third width $W_{SD}$ is, for example, greater than the second width $W_{SB}$. Also, the third width $W_{SD}$ is, for example, substantially equal to the first width $W_{SA}$.

The Y-direction width of the resistor 40 is, for example, substantially equal to the second width $W_{SB}$. The X-direction width of the resistor 40 also is substantially equal to the second width $W_{SB}$. Also, the Y-direction width of the resistor 40 is, for example, less than the third width $W_{SD}$.

As shown in FIG. 8B, for example, the second substrate part 10b is provided to jut in the X-direction from the upper portion of the first substrate part 10a. The front surface of the dielectric substrate 10 is flat; and a step that is positioned at the boundary between the first substrate part 10a and the second substrate part 10b is positioned at the back surface side.

The first substrate part 10a has the first thickness $T_{SA}$ in the Z-direction; and the second substrate part 10b has the second thickness $T_{SB}$ in the Z-direction. The first thickness $T_{SA}$ is greater than the second thickness $T_{SB}$. The first thickness $T_{SA}$ is, for example, 0.2 mm, and the second thickness $T_{SB}$ is, for example, 0.1 mm.

The second substrate part 10b is formed by, for example, cutting the back surface side of the dielectric substrate 10. The width $W_{PB}$ in the X-direction of the second substrate part 10b is, for example, 0.32 mm.

The through-hole 90 is provided in the second substrate part 10b. The through-hole 90 is formed by, for example, gold plating and includes a metal layer 95 covering the inner surface of the through-hole 90. The transmission line 23 and the metal layer 30 are electrically connected via the metal layer 95. The X-direction width of the through-hole 90 is, for example, less than the X-direction width of the transmission line 23. The Z-direction length of the through-hole 90 is, for example, substantially equal to the second thickness $T_{SB}$ of the second substrate part 10b.

As shown in FIG. 8C, the Y-direction width of the through-hole 90 is, for example, less than the third width $W_{SD}$ in the Y-direction of the transmission line 23 (see FIG.

8A). In other words, the opening area of the through-hole 90 is less than the surface area of the transmission line 23 in the X-Y plane.

Figure 9A:
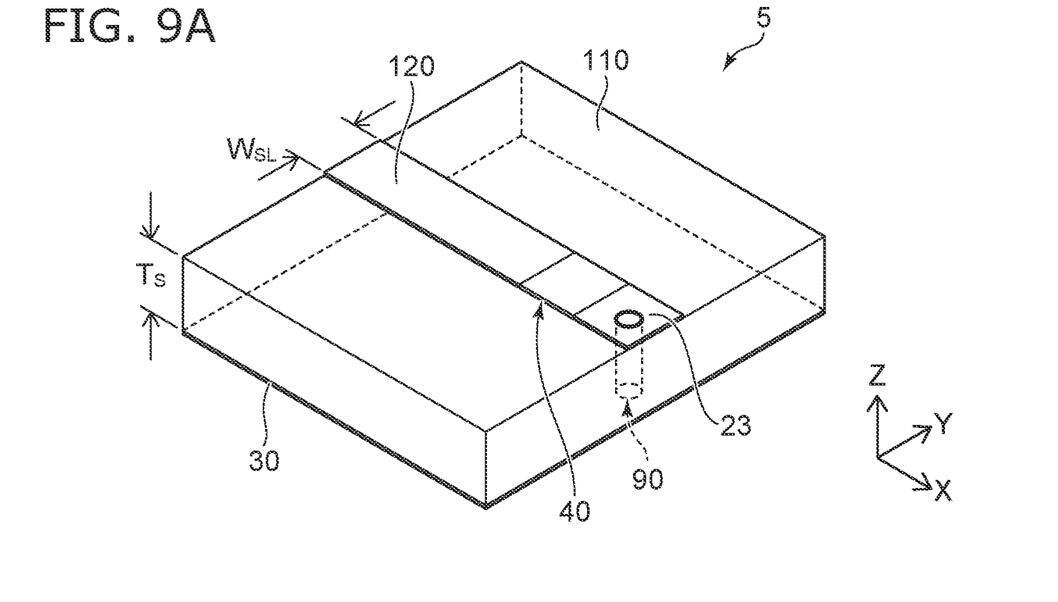
FIG. 9 is a schematic view showing a high-frequency terminator according to a comparative example of the second embodiment.
Figure 9B:
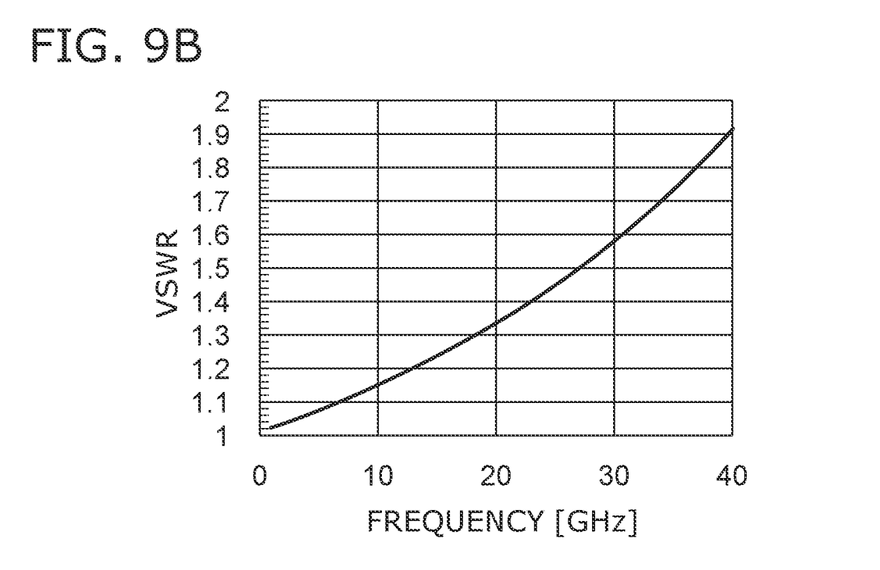

FIGS. 9A and 9B are schematic views showing a high-frequency terminator 5 according to a comparative example of the second embodiment. FIG. 9A is a perspective view showing the high-frequency terminator 5. FIG. 9B is a graph showing a characteristic of the high-frequency terminator 5. In FIG. 9B, the horizontal axis is the frequency, and the vertical axis is the VSWR.

As shown in FIG. 9A, the high-frequency terminator 5 includes the dielectric substrate 110, the transmission line 120, the transmission line 23, the metal layer 30, the resistor 40, and the through-hole 90.

The dielectric substrate 110 includes the same material as the dielectric substrate 10. The dielectric substrate 110 has a uniform thickness $T_S$ in the Z-direction over the entirety. The thickness $T_S$ of the dielectric substrate 110 is equal to the first thickness $T_{SA}$ of the first substrate part 10a of the dielectric substrate 10. The relative dielectric constant of the dielectric substrate 110 is, for example, 9.8, and tan δ is, for example, 0.0001.

The transmission line 120 is provided on the front surface of the dielectric substrate 110. The transmission line 120 has the width $W_{SL}$ in the Y-direction. The width $W_{SL}$ of the transmission line 120 is uniform over the entirety and is equal to the first width $W_{SA}$ of the first line part 20a of the transmission line 20 (see FIG. 8A).

The transmission line 23 is provided at the front surface side of the dielectric substrate 110; and the Y-direction width of the transmission line 23 is, for example, equal to the width $W_{SL}$ in the Y-direction of the transmission line 120.

The resistor 40 is provided between the transmission line 120 and the transmission line 23 at the front surface side of the dielectric substrate 110. The resistor 40 is electrically connected to the transmission lines 120 and 23. The resistor 40 has the same Y-direction width as the width $W_{SL}$ of the transmission line 120. Also, the X-direction width of the resistor 40 is equal to the width $W_{SL}$ of the transmission line 120. The resistance value of the resistor 40 is 50Ω.

The through-hole 90 is provided to extend through the dielectric substrate 110 in the Z-direction. The through-hole 90 electrically connects the transmission line 23 and the metal layer 30 provided on the back surface of the dielectric substrate 110.

As shown in FIG. 9B, the VSWR increases in the high-frequency terminator 5 as the frequency increases, and exceeds 1.9 at 40 GHz. In the high-frequency terminator 5, the reflections increase as the frequency of the high-frequency signal increases.

In the high-frequency terminator 5, for example, the reflections of the high-frequency signal can be suppressed by setting the thickness $T_S$ of the dielectric substrate 110 to be the same thickness as the second thickness $T_{SB}$ of the second substrate part 10b of the dielectric substrate 10, and by setting the width $W_{SL}$ of the transmission line 120 to be the same width as the second width $W_{SB}$ of the second line part 20b of the transmission line 20. The same VSWR as the high-frequency terminator 4 can be obtained thereby. However, the mechanical strength of the dielectric substrate 110 is greatly reduced when the thickness $T_S$ of the dielectric substrate 110 is set to the second thickness $T_{SB}$.

In the high-frequency terminator 4 according to the embodiment, by using the dielectric substrate 10 that includes the first and second substrate parts 10a and 10b, the VSWR in the high-frequency band can be improved while maintaining the strength of the dielectric substrate.

Figure 10A:
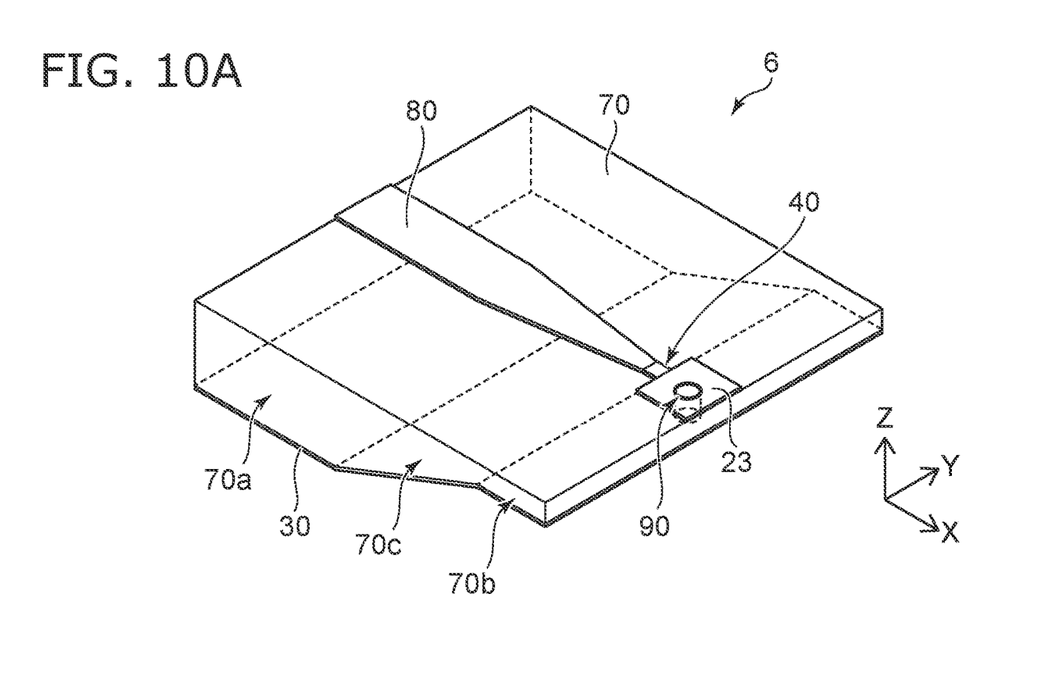
FIG. 10 is a schematic view showing a high-frequency terminator according to a modification of the second embodiment.
Figure 10B:
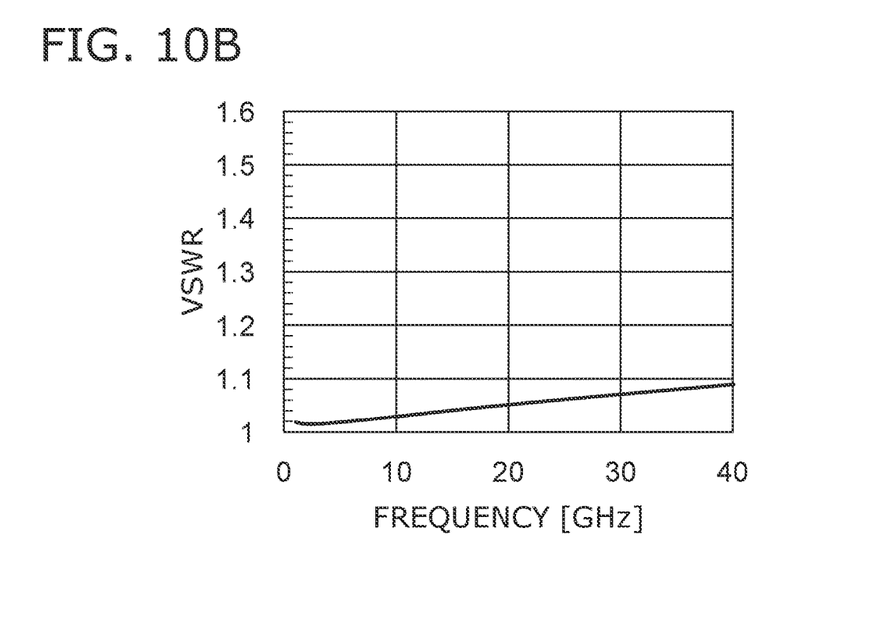

FIGS. 10A and 10B are schematic views showing a high-frequency terminator 6 according to a modification of the second embodiment. FIG. 10A is a perspective view showing the high-frequency terminator 6. FIG. 10B is a graph showing a characteristic of the high-frequency terminator 6. In FIG. 10B, the horizontal axis is the frequency, and the vertical axis is the VSWR.

Figure 11A:
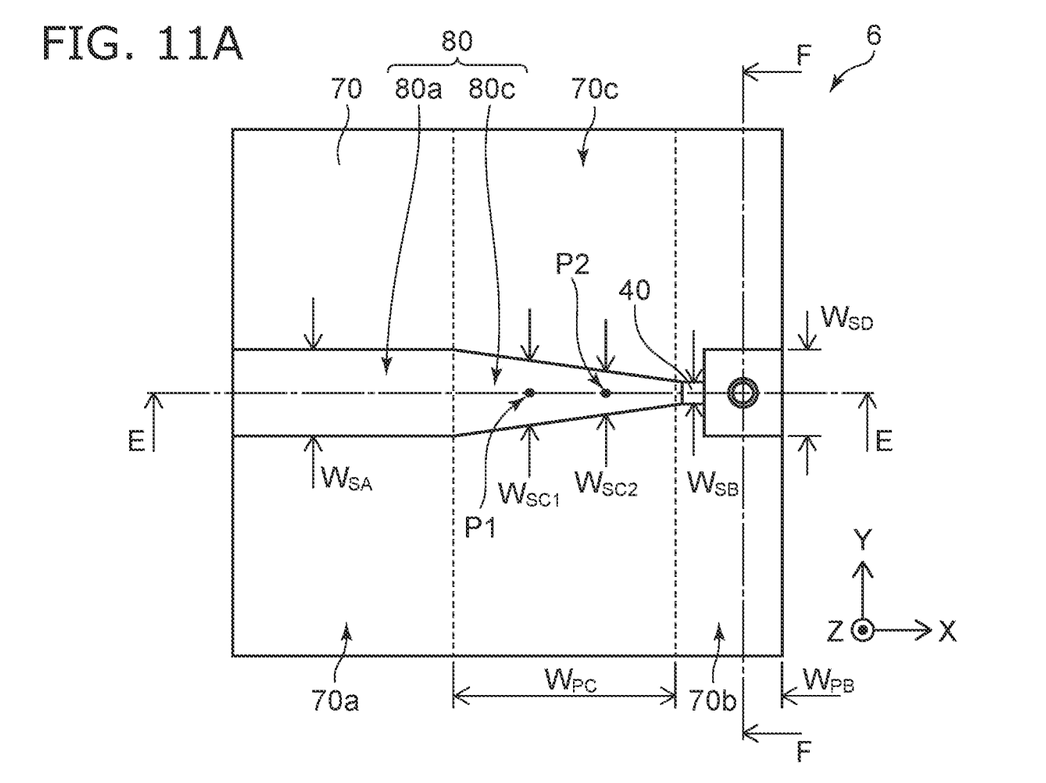
FIG. 11 is a three-view projection schematically showing the high-frequency terminator according to the modification of the second embodiment.
Figure 11B:
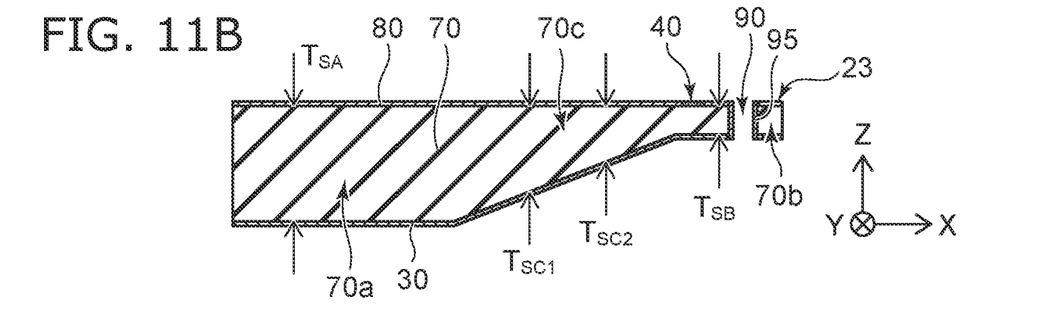

As shown in FIG. 10A, the high-frequency terminator 6 includes the dielectric substrate 70, the transmission line 80, the transmission line 23, the metal layer 30, the resistor 40, and the through-hole 90 (see FIG. 11B). The dielectric substrate 70 is, for example, a ceramic substrate that includes aluminum oxide. The relative dielectric constant of the dielectric substrate 70 is, for example, 9.8, and tan δ is, for example, 0.0001.

The dielectric substrate 70 includes the first substrate part 70a, the second substrate part 70b, and the third substrate part 70c. The first substrate part 70a, the second substrate part 70b, and the third substrate part 70c are arranged in the extension direction (the X-direction) of the transmission line 80; and the third substrate part 70c is positioned between the first substrate part 70a and the second substrate part 70b. The relative dielectric constant of the dielectric substrate 70 is, for example, 9.8, and tan δ is, for example, 0.0001.

The Z-direction thickness of the first substrate part 70a is greater than the Z-direction thickness of the second substrate part 70b; and the Z-direction thickness of the third substrate part 70c gradually decreases in the direction (the X-direction) from the first substrate part 70a toward the second substrate part 70b.

The transmission line 23 and the transmission line 80 are provided at the front surface side of the dielectric substrate 70. The front surface of the dielectric substrate 70 is flat; and the transmission line 80 extends from the first substrate part 70a toward the third substrate part 70c. The transmission line 23 is provided at the front surface side of the second substrate part 70b.

The resistor 40 is provided between the transmission line 23 and the transmission line 80 at the front surface side of the second substrate part 70b. The transmission line 23 and the transmission line 80 are electrically connected to the resistor 40. The portion of the transmission line 80 positioned at the front surface side of the third substrate part 70c is provided so that the Y-direction width becomes narrow toward the resistor 40.

At the second substrate part 70b, the through-hole 90 (see FIG. 11B) electrically connects the transmission line 23 and the metal layer 30 covering the back surface of the dielectric substrate 70.

As shown in FIG. 10B, the VSWR of the high-frequency terminator 6 is, for example, not more than 1.1 up to a frequency of 40 GHz. In other words, the VSWR is improved to an even lower level than the VSWR of the high-frequency terminator 4 shown in FIG. 7B.

Figure 11C:
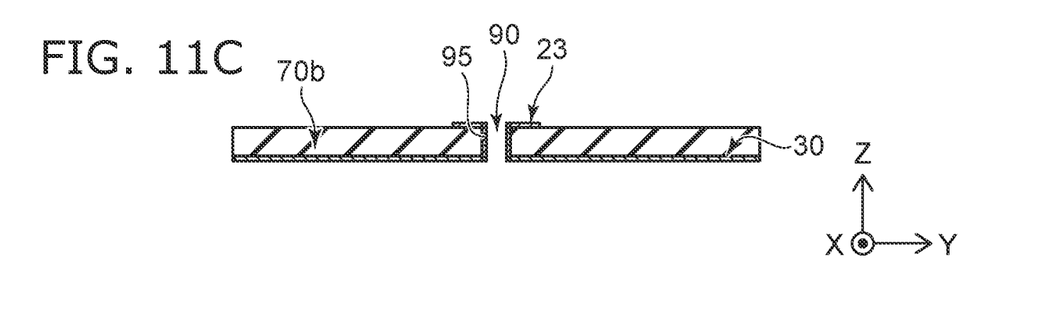

FIGS. 11A to 11C are a three-view projection schematically showing the high-frequency terminator 6 according to the modification of the second embodiment. FIG. 11A is a plan view showing the upper surface of the high-frequency terminator 6. FIG. 11B is a cross-sectional view along line E-E shown in FIG. 11A. FIG. 11C is a cross-sectional view along line F-F shown in FIG. 11A.

As shown in FIG. 11A, the transmission line 80 includes the first line part 80a and the second line part 80c. The first line part 80a is provided at the front surface side of the first substrate part 70a. The second line part 80c is provided at the front surface side of the third substrate part 70c.

The first line part 80a has the first width $W_{SA}$ in the Y-direction. The second line part 80c has a Y-direction width that gradually narrows in the direction toward the resistor 40. The second line part 80c, for example, has the first width $W_{SC1}$ in the Y-direction and the second width $W_{SC2}$ in the Y-direction respectively at the first and second positions P1 and P2 along the X-direction. The second position P2 is more proximate to the resistor 40 than the first position P1; and the second width $W_{SC2}$ is less than the first width $W_{SC1}$.

The resistor 40 has the second width $W_{SB}$ in the Y-direction. Also, the resistor 40 has substantially the same X-direction width as the second width $W_{SB}$. The upper surface of the resistor 40 is, for example, a 0.04 mm×0.04 mm square; and the resistance value of the resistor 40 is, for example, 50Ω.

The Y-direction width of the second line part 80c at the boundary between the first line part 80a and the second line part 80c is equal to the first width $W_{SA}$. Also, the second line part 80c has substantially the same Y-direction width as the second width $W_{SB}$ at the end connected to the resistor 40. The first width $W_{SA}$ of the transmission line 80 is, for example, 0.16 mm, and the second width $W_{SB}$ is, for example, 0.04 mm.

The transmission line 23 and the resistor 40 are provided on the front surface of the second substrate part 70b. The transmission line 23 has the third width $W_{SD}$ in the Y-direction; and the third width $W_{SD}$ is greater than the second width $W_{SB}$. Also, the third width $W_{SD}$ is, for example, substantially equal to the first width $W_{SA}$.

The width $W_{PB}$ in the X-direction of the second substrate part 70b is, for example, greater than the sum of the X-direction width of the resistor 40 and the X-direction width of the transmission line 23. The width $W_{PB}$ in the X-direction of the second substrate part 70b is, for example, 0.32 mm. Also, the width $W_{PC}$ in the X-direction of the third substrate part 70c is, for example, 0.4 mm.

As shown in FIG. 11B, the first substrate part 70a has the first thickness $T_{SA}$ in the Z-direction. The second substrate part 70b has the second thickness $T_{SB}$ in the Z-direction. For example, the third substrate part 70c has the first thickness $T_{SC1}$ in the Z-direction at the first position P1 (see FIG. 11A), and has the second thickness $T_{SC2}$ in the Z-direction at the second position P2 (see FIG. 11A). The second position P2 is more proximate to the resistor 40 than the first position P1; and the second thickness $T_{SC2}$ is less than the first thickness $T_{SC1}$.

The Z-direction thickness of the third substrate part 70c at the boundary between the first substrate part 70a and the third substrate part 70c is substantially equal to the first thickness $T_{SA}$. Also, the Z-direction thickness of the third substrate part 70c at the boundary between the second substrate part 70b and the third substrate part 70c is substantially equal to the second thickness $T_{SB}$.

The Z-direction thickness of the dielectric substrate 70 and the Y-direction width of the transmission line 80, for example, are set so that the characteristic impedance of the transmission line 80 is 50Ω. In the example, the first thickness $T_{SA}$ of the dielectric substrate 70 is, for example, 0.2 mm, and the second thickness $T_{SB}$ is, for example, 0.05 mm.

The through-hole 90 is provided in the second substrate part 70b. The through-hole 90 is formed by, for example, Au plating and includes the metal layer 95 that covers the inner surface of the through-hole 90. The transmission line 23 and the metal layer 30 are electrically connected by the metal layer 95 provided at the inner surface of the through-hole 90.

The Z-direction length of the through-hole 90 is, for example, substantially equal to the second thickness $T_{SB}$. Also, the X-direction width of the through-hole 90 is less than the X-direction width of the transmission line 23.

As shown in FIG. 11C, the opening area of the through-hole 90 is less than the surface area of the transmission line 23 in the X-Y plane.

In the high-frequency terminator 6, the Y-direction widths of the first line parts 80a and the second line parts 80c are the same (the first width $W_{SA}$) at the boundary between the first line part 80a and the second line part 80c. The reflections of the high-frequency signal at the boundary between the first line part 80a and the second line part 80c can be suppressed thereby.

In the high-frequency terminator 4 shown in FIG. 7A, for example, the Z-direction width of the first line part 20a and the Z-direction width of the second line part 20b are different at the boundary between the first line part 20a and the second line part 20b. Therefore, the reflections of the high-frequency signal at the boundary between the first line part 20a and the second line part 20b in the high-frequency terminator 4 are greater than that in the high-frequency terminator 6.

In other words, by suppressing the reflections of the high-frequency signal at the boundary between the first line part 20a and the second line part 20b, the VSWR is improved in the high-frequency terminator 6 compared to the VSWR of the high-frequency terminator 4.

Although the high-frequency terminators 1, 3, 4, and 6 according to the first and second embodiments are described above, embodiments are not limited to these high-frequency terminators. Also, for example, metal wires may be used to connect the high-frequency terminators described above to a high-frequency circuit provided in a substrate other than the dielectric substrate 10 or 70; and the high-frequency terminators described above may be provided at the outer edge part of a substrate that includes a high-frequency circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A high-frequency terminator, comprising:
   a dielectric substrate;
   a metal layer provided at a back surface side of the dielectric substrate;
   a transmission line provided at a front surface side of the dielectric substrate;
   a resistor provided at the front surface side of the dielectric substrate, the resistor being connected to the transmission line; and
   a conductor electrically connecting the resistor and the metal layer,
   the dielectric substrate including
      a first substrate part having a first thickness in a first direction, the first direction being from the back surface toward the front surface of the dielectric substrate, and a second substrate part having a second thickness in the first direction, the second thickness being less than the first thickness, the front surface of the dielectric substrate being flat, a step between the first substrate part and the second substrate part being provided in the back surface side, the transmission line extending from the first substrate part to the second substrate part and being connected to the resistor on the second substrate part, the conductor electrically connecting the metal layer and the resistor at the second substrate part.

2. The high-frequency terminator according to claim 1, wherein
the second substrate part is positioned at an outer edge of the dielectric substrate.

3. The high-frequency terminator according to claim 2, wherein
the conductor is provided on a side surface linked to the back and front surfaces at the outer edge of the dielectric substrate.

4. The high-frequency terminator according to claim 1, wherein
the conductor covers an inner surface of a through-hole extending through the second substrate part, and
the conductor is connected to the metal layer at the back surface side.

5. The high-frequency terminator according to claim 1, wherein
the transmission line includes:
a first line part positioned on the first substrate part; and
a second line part positioned on the second substrate part, a second direction is along the front surface of the dielectric substrate and crosses an extension direction of the transmission line, and a width in the second direction of the first line part is greater than a width in the second direction of the second line part in the second direction.

6. The high-frequency terminator according to claim 5, wherein
the dielectric substrate further includes a third substrate part positioned between the first substrate part and the second substrate part,
the third substrate part has
a third thickness in the first direction at a first position along the extension direction of the transmission line, and
a fourth thickness in the first direction at a second position along the extension direction,
the fourth thickness at the second position is less than the third thickness at the first position, and
the second position is more proximate to the resistor than the first position.

7. The high-frequency terminator according to claim 6, wherein
the first position and the second position are provided on the second line part,
the second line part has
a first width in the second direction at the first position, and
a second width in the second direction at the second position, and
the first width is greater than the second width.

* * * * *